United States Patent
Herbold (12)

(10) Patent No.: US 6,420,989 B1
(45) Date of Patent: Jul. 16, 2002

(54) PROGRAMMABLE NON-UNIFORM CLOCK SIGNAL GENERATOR

(75) Inventor: Jacob Herbold, Portland, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/767,435

(22) Filed: Jan. 22, 2001

(51) Int. Cl.[7] .................................................. H03M 1/12
(52) U.S. Cl. ...................................... 341/155; 341/163
(58) Field of Search ................................. 341/155, 163, 341/110, 111, 164, 162, 159; 327/158, 161

(56) References Cited

U.S. PATENT DOCUMENTS 6,100,735 A  * 8/2000  Lu .............................. 327/158
6,154,165 A  * 11/2000 Gross, Jr. ..................... 341/164
6,310,570 B1 * 10/2001 Rumreich et al. ........... 341/155
6,327,196 B1 * 12/2001 Mullarkey .................... 365/194

* cited by examiner

*Primary Examiner*—Peguy Jeanpierre
*Assistant Examiner*—Joseph J Lauture
(74) *Attorney, Agent, or Firm*—Daniel J. Bedell; Smith-Hill and Bedell

(57) ABSTRACT

A clock signal generator produces an output clock signal having signal pulse timing adjustable with a resolution of P seconds. To produce a clock signal having an average frequency that is other than $1/k*P$, where k is an integer, the clock signal generator occasionally adjusts the period between successive pulses of the clock signal.

30 Claims, 9 Drawing Sheets

PROGRAMMABLE NON-UNIFORM CLOCK SIGNAL GENERATOR

BACKGROUND OF THE INVENTION

1. Field of the Invention

The present invention relates in general to a programmable clock signal generator which adjusts timing of successive pulses of its output clock signal with a resolution of P seconds, and in particular to a clock signal generator programmed to produce a clock signal having an average period between successive pulses of j*P seconds, where j is a non-integer number, by providing non-uniform intervals between successive clock signal pulses.

2. Description of Related Art

FIG. 1 depicts in block diagram form a prior art clock signal generator 10 for providing an adjustable frequency clock signal MCLK synchronized to a reference clock signal ROSC having period $P_{ROSC}$ provided by a stable oscillator 24. Clock signal generator 10 includes a set of gates 14 connected in a closed loop to form a ring oscillator 16. Ring oscillator 16 provides a set of N tap signals $T_0-T_{N-1}$ at the outputs of gates 14. In the example illustrated in FIG. 1, N is 5.

The ROSC signal output of counter 17 and tap signal $T_4$ serve as inputs to a conventional phase lock loop (PLL) controller 18. Controller 18 produces a CNTRL signal supplying power to all gates 14 for adjusting the switching speed of the gates. When tap signal $T_4$ lags the ROSC signal, controller 18 sets the CNTRL signal voltage to increase the switching speed of gates 14. When tap signal $T_4$ leads the ROSC signal, controller 18 adjusts the CNTRL signal voltage to decrease the switching speed of gates 14. Thus controller 18 compares signal ROSC to signal $T_4$ and adjusts the switching speed of all gates 14 to phase lock the $T_4$ signal to the ROSC signal.

A multiplexer 20 having five inputs 0–4 produces output signal MCLK. Tap signals $T_0-T_4$ drive multiplexer inputs 0–4 through a set of pulse shaping circuits 19. A sequencer 23 produces a control data sequence SW to signal multiplexer 20 to deliver one of its input signals to a gating circuit 21 at its output on each cycle of the ROSC signal. Gating circuit 21 normally passes the output signal of multiplexer 20 as the MCLK output of clock signal generator 10. However, sequencer 23 may also occasionally produce a SKIP signal pulse telling gating circuit 21 to block the output of multiplexer 20 for the next ROSC signal cycle. The SKIP signal also tells another gating circuit 22 to block a next ROSC signal pulse from clocking sequencer 23. A PROG signal tells sequencer 23 precisely what values to assign to the SW data sequence as well as when to assert the SKIP signal. The SW data and SKIP signal sequences control the timing of each pulse of the MCLK clock signal, and thereby control the phase and frequency of the MCLK signal.

FIG. 2 illustrates the timing with respect to the ROSC signal of the various signals IN(0)–IN(4) provided to multiplexer inputs 0–4. The ROSC signal and input signals IN(0)–IN(4) all have the same frequency, and the phase of the IN(4) input signal matches the phase of the ROSC signal. Input signal IN(0) is delayed with respect to the ROSC signal by P, the switching delay of one gate. Each successive signal of the remaining input signals IN(k) is delayed with respect to the ROSC signal by an additional (k+1)*P. Thus, for example, IN(3) is delayed with respect to the ROSC signal by 4P.

FIG. 2 also illustrates examples MCLK(a)–MCLK(d) of output signal MCLK provided in response to four different SW and SKIP signal patterns. Suppose we want an output signal MCLK(a) with the same frequency as ROSC but with a different phase. To do this we program sequencer 23 to set signal SW so that multiplexer 20 selects input signal IN(1) on each cycle of the ROSC signal and never asserts the SKIP signal. Thus, signal SW supplies a sequence of data values to multiplexer 20 of the form SW={1,1,1, . . . }. The resultant signal MCLK(a) is shifted in phase by 2P with respect to the ROSC signal.

Alternatively, when we want clock signal generator 10 to produce an output signal MCLK(b) having a period equal to $1.2P_{ROSC}$, then we program sequencer 23 to set signal SW to value SW=0 for the first ROSC period and then switch signal SW to value SW=1 at the start of the second ROSC period and so on. Note that because MCLK(b) is of lower frequency than ROSC, the gating circuit 22 must occasionally block a multiplexer output pulse. This occurs, for example, during the fifth ROSC cycle. Thus sequencer 23 asserts the SKIP signal to gating circuits 21 and 22 during the fifth ROSC cycle to tell gating circuit 21 to inhibit the MCLK output of multiplexer 21 and to gating circuit 22 to inhibit sequencer 23 from supplying signal SW to multiplexer 21. Thus, to produce MCLK(b) signal SW is a repetitive sequence SW={0,1,2,3,4} while the skip signal has the form SKIP={0,0,0,0,1}.

When we want clock signal generator 10 to produce an output signal MCLK(c) with a period equal to $1.4P_{ROSC}$, then we program sequencer 23 to generate a repeating SW signal sequence of the form SW={0,2,4,1,3} with a corresponding SKIP signal of the form SKIP={0,0,1,0,0,0,1}. A set of SW and SKIP data sequences of the form SW={0,0,0, . . . } and SKIP={0,1,0,1, . . . } produces an output signal MCLK(d) with a period twice that of the ROSC signal, or $2P_{ROSC}$.

Thus clock signal generator 10 can produce a variety of output clock signals MCLK whose frequencies depend on the programming of sequencer 23. However, the resolution P with which clock signal generator 10 can adjust the period of its MCLK output signal is limited to the period $P_{ROSC}$ of the ROSC signal divided by the number N of gates 14 in oscillator 16, or $P_{ROSC}/N$. In the example illustrated in FIG. 1, the period resolution of clock signal generator 10 is $P=P_{ROSC}/5$.

By adding more gates 14 to oscillator 16 we can improve the period resolution P of clock signal generator 10, but when N becomes sufficiently high $P=P_{ROSC}/N$ falls to a level that is masked by the noise or "jitter" in the MCLK output. In other words, as N increases, the delay difference, P, between successive tap signals $T_N$ and $T_{N+1}$ reaches a point where it becomes smaller than the magnitude of the uncertainty in the edges of the MCLK output signal. The jitter in the MCLK clock signal arises from a variety of factors including slight differences in the inherent switching delay of individual gates 14, the cumulative effects of stochastic noise ("shot noise") on the terminals of the gates 14 and natural oscillations in the feedback loop provided by controller 18. These factors can not be readily eliminated from the type of components forming clock signal generator 10. Also the resolution P of clock signal generator 10 can be no smaller than the minimum switching time of gates 14.

Thus we cannot increase the period resolution of the clock signal generator 10 by increasing the number N of gates 14 beyond that point at which the resolution becomes larger than the jitter or noise on MCLK or smaller than the minimum possible gate switching time. Unfortunately, many potentially useful applications for delay line based clock signal generators require higher clock period resolutions. What is needed is a delay line based clock signal generator with a higher effective period resolution.

SUMMARY OF THE INVENTION

A programmable clock signal generator adjusts timing of successive pulses of its output clock signal with a resolution of P seconds, where P is a constant. Thus edges of successive pulses of the clock signal are always separated by an interval of k*P seconds where k is an integer. In accordance with one aspect of the invention, the clock signal generator is programmed to produce a clock signal having an average period between successive pulses of j*P seconds, where j is a non-integer number by providing non-uniform intervals between successive clock signal pulses. For example, when the clock signal generator provides a clock signal having N pulse intervals of k for every one pulse interval of k+1, then the average interval between clock signal pulses is (N*k+1)P/(N+1). Note that the quantity (N*k+1)/(N+1) is not an integer for most combinations of integer values of N and k. While such a "non-uniform clock signal" only approximates a "uniform clock signal" having uniform intervals of (N*k+1)P/(N+1) seconds between successive pulses, the non-uniform clock signal is nonetheless useful as a substitute for the uniform clock signal in applications that can tolerate small pulse timing errors.

For example, in accordance with another aspect of the invention a non-uniform clock signal is used in lieu of a uniform clock signal to control a rate at which a data sequence is supplied as input to a digital-to-analog converter (DAC). Although the analog signal produced by the DAC will be a somewhat distorted version of an analog signal the DAC would have produced had it been clocked by a uniform clock signal, the non-uniform clock signal will be an acceptable substitution for the uniform clock signal when the amount of analog signal distortion remains within an acceptable limit.

As another example, in accordance with a further aspect of the invention, such a non-uniform clock signal is used in lieu of a uniform clock signal to clock an analog-to-digital (A/D) converter for digitizing an analog signal at an average rate of (N*k+1)P/(N+1) seconds. Although the non-uniform clock signal's pulse timing errors can cause errors in the digitizer's output data, the non-uniform clock signal is a suitable substitute for the uniformly spaced clock signal when the data errors are within acceptable limits.

In applications where errors arising from use of such a non-uniform clock signal in lieu of a uniform clock signal are unacceptably large, the errors can be corrected. For example, a conventional Fourier transform algorithm can analyze the data output of the A/D converter to determine the frequency spectrum of the analog signal. However, errors in clock signal pulse timing will cause errors in frequency spectrum determination. If those errors are unacceptable, then in accordance with another aspect of the invention, the Fourier transform algorithm can be modified to compensate for the known, predictable clock signal pulse timing errors.

It is accordingly an object of the invention to provide a clock signal generator having a pulse timing resolution of P seconds which can nonetheless produce an output clock signal have an average period between pulses that is other than an integer multiple of P.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DETAILED DESCRIPTION OF THE INVENTION

Figure 1:
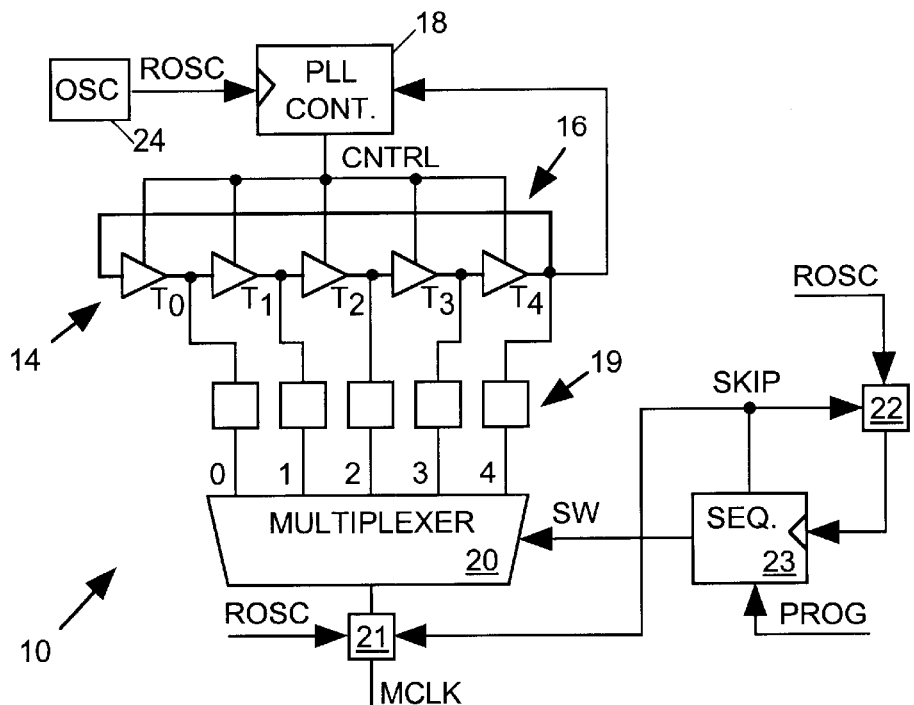
FIG. 1 depicts in block diagram form a prior art clock signal generator.
Figure 3:
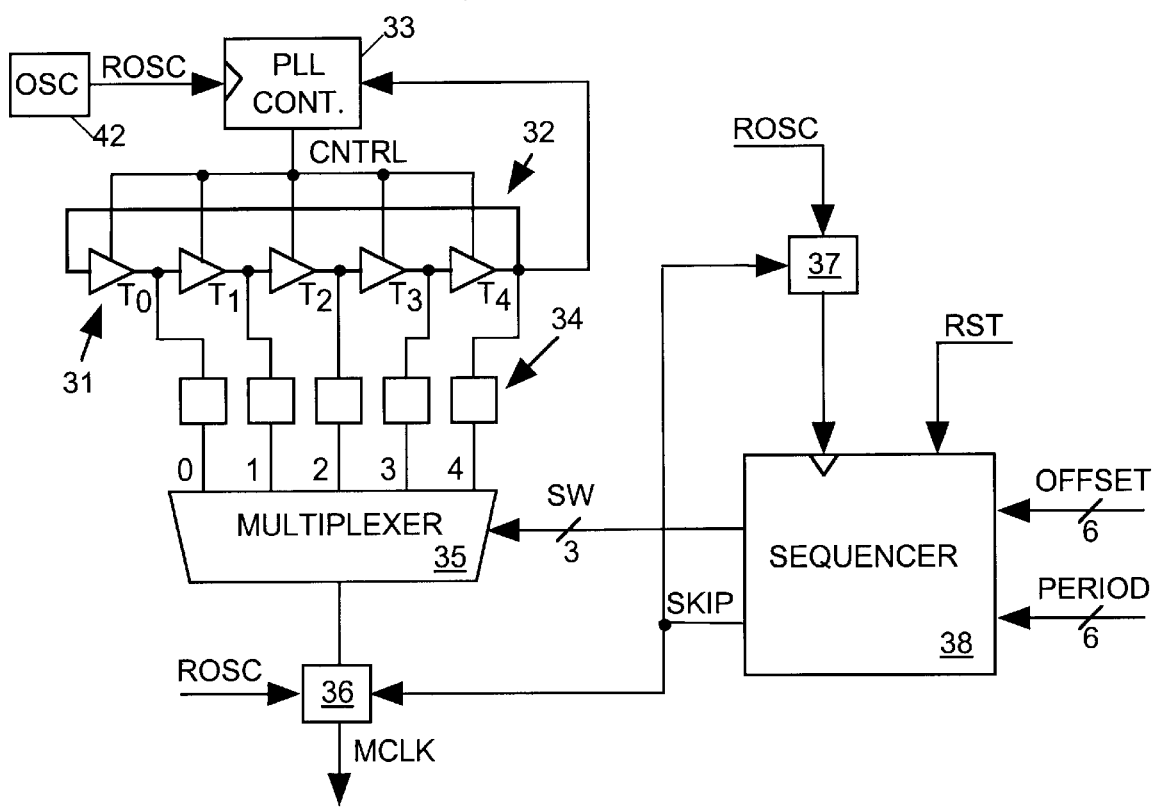
FIG. 3 is a block diagram of a clock signal generator in accordance with the invention.
Figure 2:
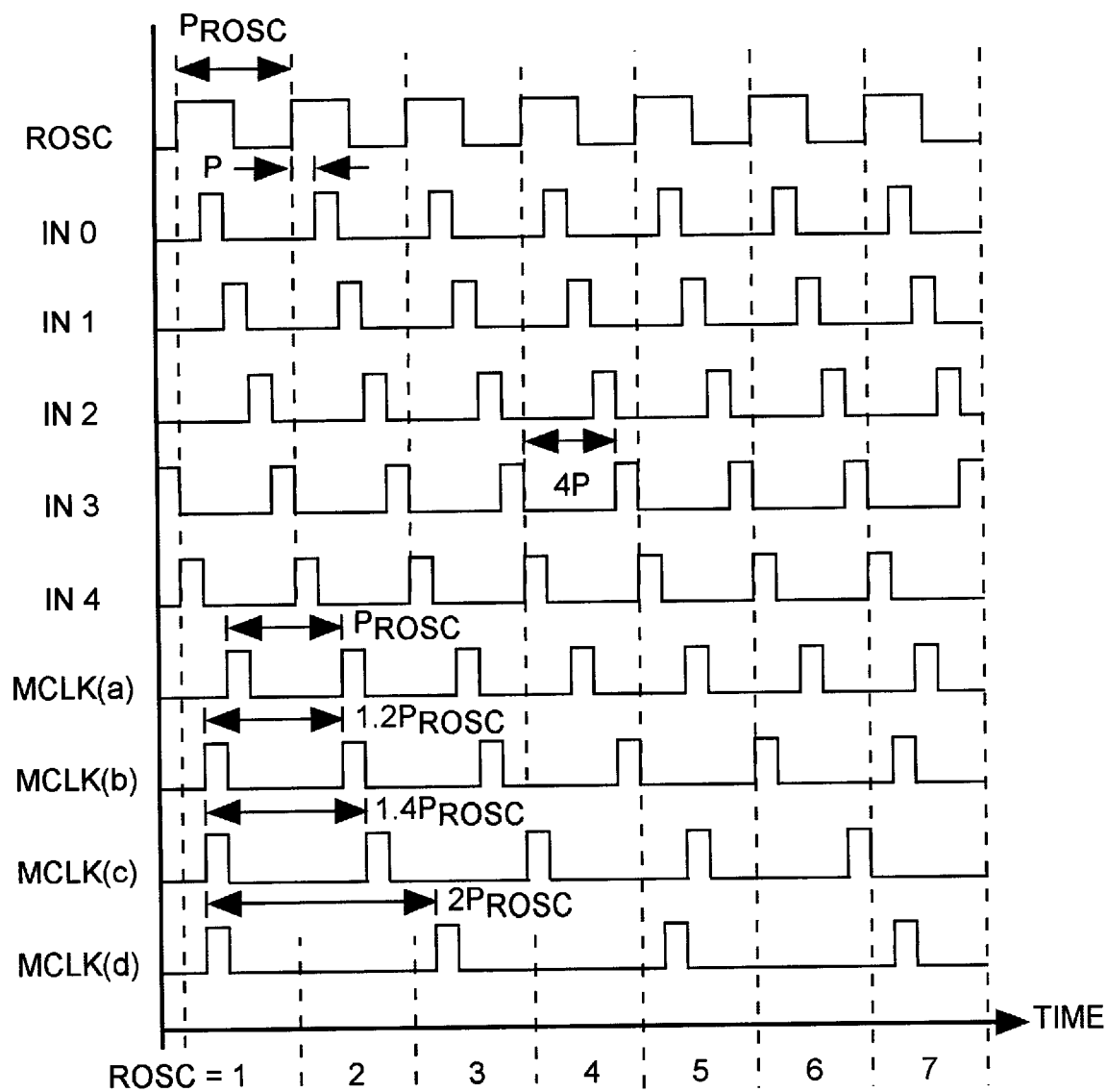
FIG. 2 is a timing diagram illustrating timing relationships between various signals of FIG. 1.

FIG. 3 illustrates a clock signal generator 30 which, like prior art signal generator 10 of FIG. 1, can produce an output clock signal MCLK of adjustable frequency, such as any of clock signals MCLK(a)–(d) illustrated in FIG. 2. Clock signal generator 30 provides MCLK clock signals synchronized to a reference ROSC clock signal generated by a stable oscillator 42 and having a period of $P_{ROSC}$. A ring oscillator 32, phase locked to the ROSC signal by a phase-locked loop (PLL) controller 33, generates a set of five tap signals $T_0$–$T_4$. Each tap signal $T_k$ is delayed from its preceding tap signal by P, the switching delay of one gate 31, and is therefore phase shifted from the ROSC signal by (k+1)*P. Controller 33 compares the ROSC signal to the tap signal $T_4$ and uses a CNTRL signal to adjust the delay P of gates 31 to frequency lock tap signal $T_4$ to the ROSC signal. Since oscillator 32 has five gates 31, clock signal generator 30 can provide MCLK clock signals with a period resolution of P equal to $P_{ROSC}/5$, where $P_{ROSC}$ is the period of the ROSC signal.

A multiplexer 35 having five inputs 0–4 supplies its output to a gating circuit 36 which produces signal MCLK. Tap signals $T_0$–$T_4$ drive multiplexer inputs 0–4 through a set of pulse shaping circuits 34. A sequencer 38 produces a control data sequence SW telling signal multiplexer 35 to deliver one of its input signals to gating circuit 36 on each cycle of the ROSC signal. Gating circuit 36 normally passes the output signal of multiplexer 35 to provide the MCLK output of clock signal generator 30. However, sequencer 38 may also occasionally produce a SKIP data pulse, and that pulse tells gating circuit 36 to block the output of multiplexer 35 for the next ROSC signal cycle. The SKIP data also tells another gating circuit 37 to block a next ROSC signal pulse from clocking sequencer 38. Two 6-bit control data words OFFSET and PERIOD instruct sequencer 38 to provide specific SW and SKIP data sequences.

The SW and SKIP data sequences control the timing of each pulse of the MCLK clock signal, and thereby control the phase and frequency of the MCLK signal. For example, when sequencer 38 never asserts the SKIP data and generates an SW data sequence of the form SW={1,1,1, . . . }, multiplexer 35 selects signal IN(1) on each period of the ROSC signal, thereby producing output clock signal MCLK (a) of FIG. 2. Note that the MCLK(a) signal has the same frequency as the ROSC signal but is phase shifted from the ROSC signal by 2P. Other SW and SKIP data sequences can produce MCLK signals having other frequencies such as for example signals MCLK(b)–(d) of FIG. 2.

The resolution with which clock signal generator 30 can adjust the phase and frequency of the MCLK signal is P, the switching delay of each gate 31. Since oscillator 32 has five gates 31, clock signal generator 30 has a timing resolution of $P_{ROSC}/5$, To increase the period resolution we can increase the number N of gates 31 in oscillator 32, but there is a limit to the number N of gates 31 oscillator 32 can have. Since each gate 31 must be able to switch at a rate of $P_{ROSC}/N$, we cannot increase N beyond a point where the gates 31 do not have sufficient time to switch. Also when $P_{ROSC}/N$ becomes smaller than the noise or timing jitter in the MCLK clock signal further increases in N do not help to improve timing resolution.

Figure 4:
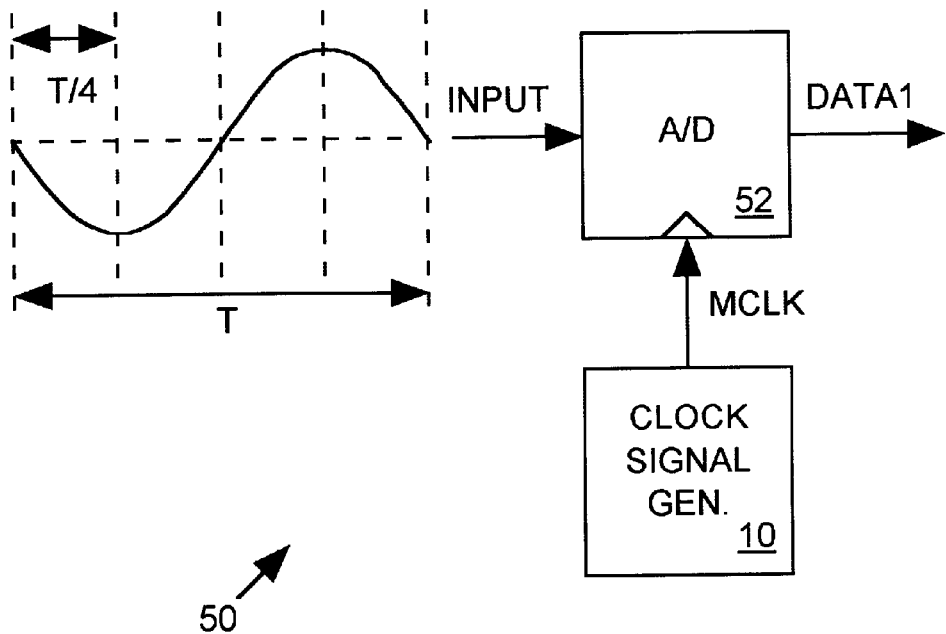
FIG. 4 is a block diagram of a prior art apparatus for the conversion of analog signals into digital data sequences.

FIG. 4 illustrates in block diagram form a prior art digitizer 50 for digitizing an analog INPUT signal having a period T. An analog-to-digital (A/D) converter 52, clocked by an MCLK clock signal supplied by prior art clock signal generator 10 of FIG. 1, samples an analog INPUT signal voltage and generates a corresponding digital value of its output waveform data sequence DATA1.

Figure 5:
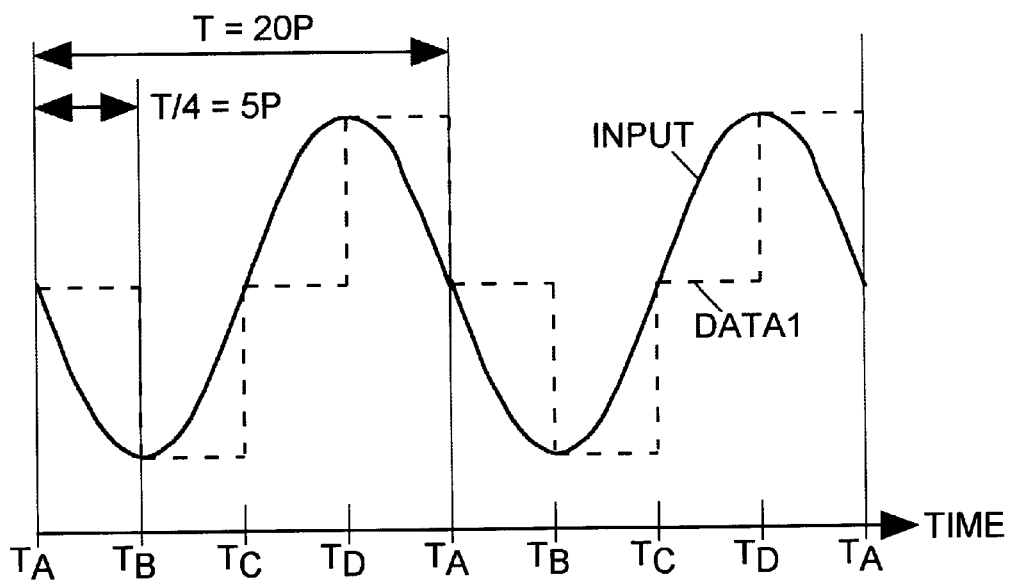
FIG. 5 is a timing diagram illustrating timing relationships between the INPUT and OUTPUT signals of FIG. 4 when the period used to sample the INPUT signal is an integer multiple of the clock signal period resolution.

FIG. 5 is a timing diagram depicting an INPUT signal to digitizer 50 of FIG. 4 having a period T=20P. If digitizer 50 digitizes each period of the INPUT signal at four evenly spaced intervals $T_A$–$T_D$ then each sampling interval T/4=5P is an integer multiple of the period resolution P=$P_{ROSC}/5$ of clock signal generator 10. Thus the DATA1 sequence values A/D converter 52 produces accurately represent the INPUT signal level at each desired sample time $T_A$–$T_D$.

Figure 6:
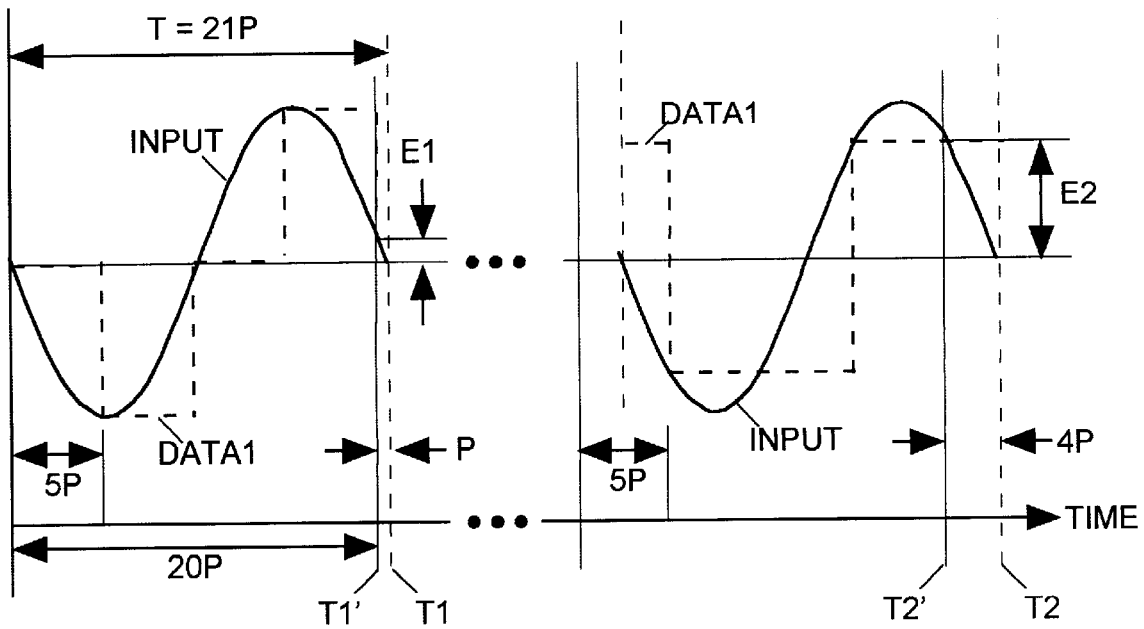
FIG. 6 is a timing diagram illustrating timing relationships between the INPUT and OUTPUT signals of FIG. 4 when the period used to sample the INPUT signal is not an integer multiple of the clock signal period resolution.

While clock signal generator 10 of FIGS. 1 and 4 can only produce MCLK signals having periods between successive pulses that are integer multiples of P, some circumstances may require MCLK clock signals capable of matching periods that are not integer multiples of $P_{ROSC}/N$. For example, FIG. 6 is a timing diagram illustrating an INPUT signal to digitizer 50 of FIG. 4 having a period T=21P. If we want digitizer 50 to digitize the INPUT signal four times every cycle, then clock signal generator 10 of FIG. 4 should produce an MCLK signal having a period $P_{MCLK}$ equal to T/4, or 21P/4=5.25P. But since the period $P_{MCLK}$ of the MCLK signal can only be equal to kP, where k is an integer, then clock signal generator 10 of cannot produce an MCLK signal having a period 5.25P.

Figure 7:
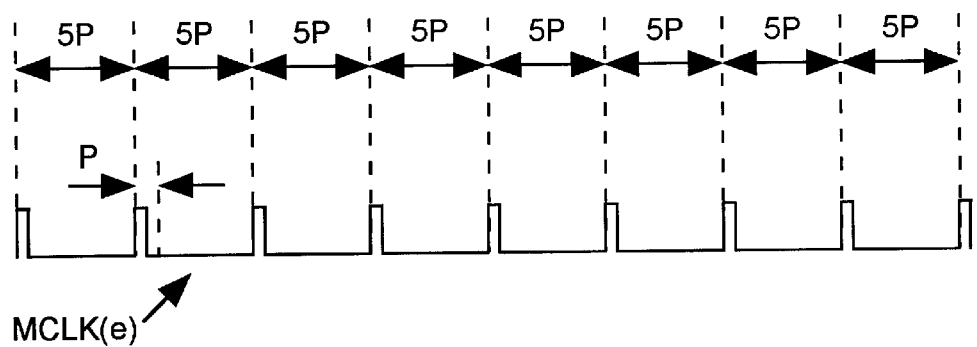
FIG. 7 is a timing diagram illustrating a timing signal produced by the prior art clock signal generator of FIG. 1.

Clock signal generator 10 can produce an MCLK signal of period 5P such as the signal MCLK(e) illustrated in FIG. 7 that closely approximates the desired INPUT signal sampling rate 5.25P. FIG. 6 compares an actual sample timing resulting from the use of the MCLK(e) signal having a period of 5P to a desired sampling timing of 5.25P. An actual sampling time T1' corresponding to end of the first four cycles of the MCLK(e) signal precedes a desired sampling time T1 by an interval of P. The magnitude of the INPUT signal at actual sampling time T1' differs from the magnitude of the INPUT signal at the desired sampling time T1 by an amount E1. If the sample timing error (T1–T1') is small then E1 will be small, and the value of DATA1 may be no different than A/D converter 52 would have produced had there been no timing error. This would be likely if E1 is significantly smaller than the resolution of A/D converter 52. Also when the timing error (T1–T1') is smaller than the normal variation in sample timing due to noise or jitter in the MCLK(e) signal, then the timing error is less likely to lead to unacceptable error in the DATA1 values.

However the timing error is cumulative; it increases with every pulse of the MCLK(e) signal. In this example, the timing error increases by P/4 after each pulse of the MCLK (e) signal. At an actual sampling time T2' corresponding to the end of the $16^{th}$ MCLK(e) signal pulse, the timing error between actual sampling time T2' and desired sampling time T2 has increased to 4P, or approximately 13% of the INPUT signal period T. A timing error this large will likely exceed any jitter in the MCLK(e) signal and thus would produce an unacceptably large, noticeable error in the timing of the DATA1 values. The difference E2 between the magnitudes of the INPUT signal at times T2' and T2 would also likely exceed the resolution of A/D converter 52.

Hence we can see that for prior art digitizer 50 of FIG. 4 the use of an MCLK signal having a period that does not exactly match a desired sampling period will eventually cause a noticeably large error in the DATA1 sequence.

Error Compensation (Digitizer)

Figure 8:
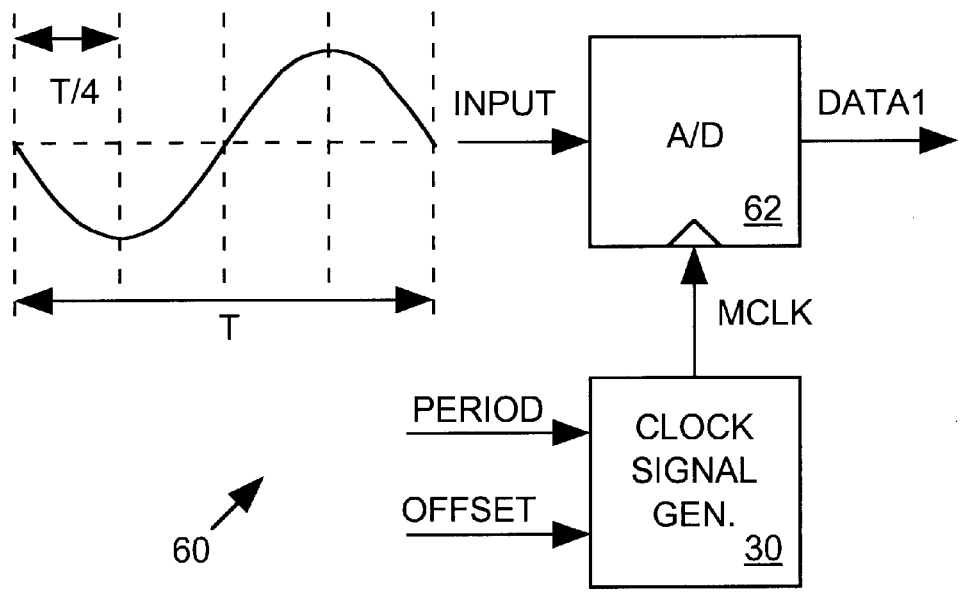
FIG. 8 is a block diagram of an apparatus for the conversion of analog signals into digital data sequences in accordance with the invention.
Figure 9:
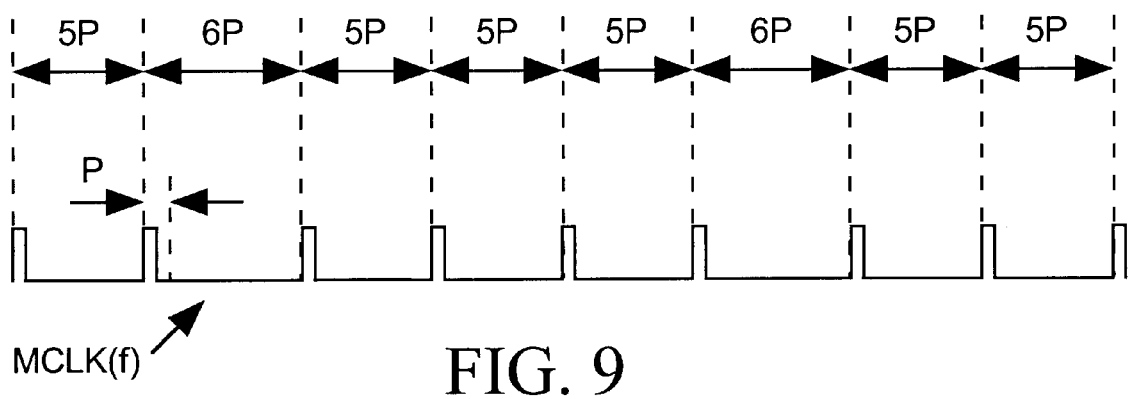
FIG. 9 is a timing diagram illustrating a timing signal produced in accordance with the invention by the clock signal generator of FIG. 3.

FIG. 8 illustrates a digitizer 60 employing the clock signal generator 30 of FIG. 3 to clock an A/D converter 62 converting a time varying analog INPUT signal into a digital data sequence DATA1. In accordance with the invention, clock signal generator 30 occasionally adjusts the delay between successive MCLK signal edges in a systematic and predetermined manner so that timing errors do not accumulate without limit. FIG. 9 is a timing diagram showing an MCLK signal, MCLK(f) produced by clock signal generator 30 of FIG. 8 wherein the second MCLK(f) signal period and every fourth MCLK(f) signal period thereafter are of duration 6P while all other periods are of duration 5P. The MCLK(f) signal has an average frequency of P*((3*5+6)/4) or 21P/4.

Figure 10:
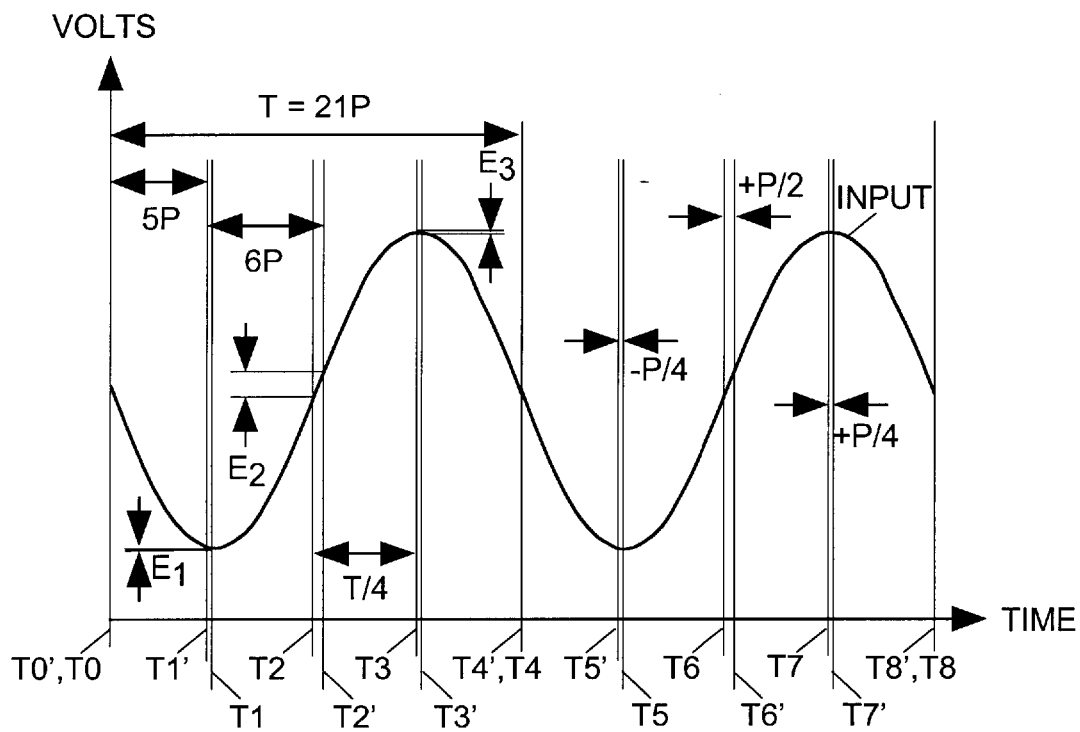
FIG. 10 is a timing diagram comparing the actual sample timing to the desired sample timing of the INPUT signal of the apparatus of FIG. 9 when the period used to sample the INPUT signal is not an integer multiple of the clock signal period resolution and wherein timing errors have been compensated for in accordance with the invention.
Figure 10A:
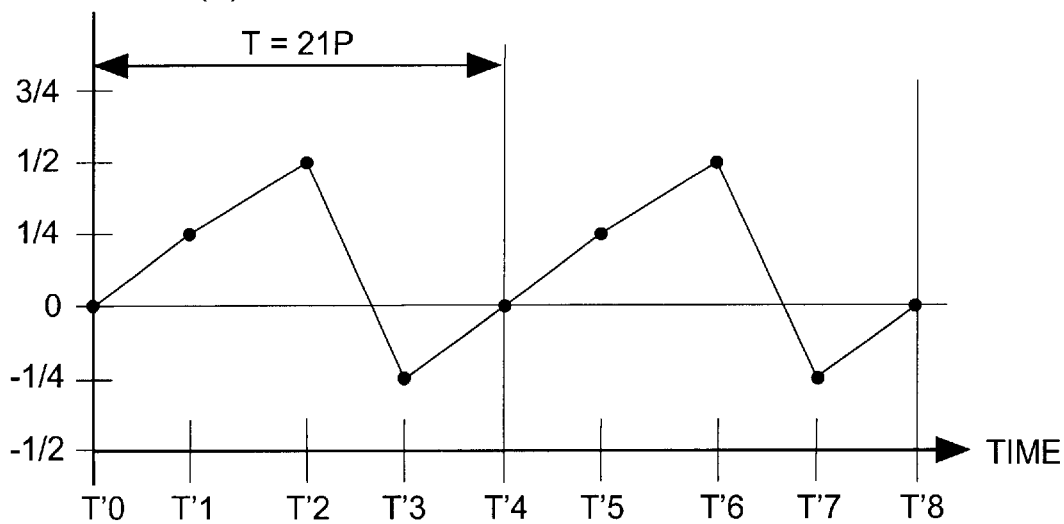
FIG. 10A is a timing diagram illustrating timing errors associated with the actual sample timing of the INPUT signal of FIG. 9 as shown in FIG. 10.

FIG. 10 and 10A are timing diagrams illustrating how the MCLK(f) signal of FIG. 9 produced by clock signal generator 30 of FIG. 8 limits accumulating timing errors when the INPUT signal has a period T=21P and is digitized at a nominal interval of 21P/4. At actual sampling time T1', corresponding to the end of the first MCLK(f) signal cycle having period 5P, the timing error (T1–T1') has magnitude—P/4 and the resulting error E1 in the sampling of the INPUT signal magnitude is small. At actual sampling time T2', corresponding to the end of the second MCLK(f) signal cycle having period 6P, the timing error (T2'–T2) has grown to +P/2 and the resulting error E2 is proportionately larger than E1. By actual sample time T3', corresponding to the end of the third MCLK(f) signal cycle having period 5P , the timing error has been reduced to –P/4 yielding a correspondingly small INPUT signal magnitude sampling error of E3. Finally by actual sampling time T4' the timing error compensation applied over the interval between times T1' and T2' has fully corrected for the accumulating timing error so that actual sampling time T4' coincides with the desired sampling time T4. This adjustment of the sampling interval repeats once every four cycles of the MCLK(f) signal.

Note that the timing error in FIGS. 10 and 10A is periodic about zero and has a maximum value of P/2. For digitizer 60 of FIG. 8 a periodic non-accumulating timing error may be acceptable when the maximum resulting error $E_2$ in the sampled data DATA1 is within tolerable limits. In the prior art system of FIG. 4, where the timing is only approximated by a clock signal of fixed period 5P , the error accumulates without limit and will eventually cause unacceptable errors in the DATA1 values as shown in FIG. 6.

In the relatively simple example of FIGS. 9 and 10, the error compensation period occurs on every $4^{th}$ cycle of the MCLK(f) signal. In general the correction should be timed to occur whenever the timing error exceeds P/2. For example, if the timing error accumulating with each cycle of the INPUT signal is P/5 and the MCLK signal frequency is ten times the INPUT signal frequency then clock signal generator 30 need only compensate for this error by adding an additional time unit P to every $24^{th}$ MCLK signal cycle in order to restrict the timing error to a maximum value of P/2.

Error Compensation (Digital Spectrum Analyzer)

Figure 11:
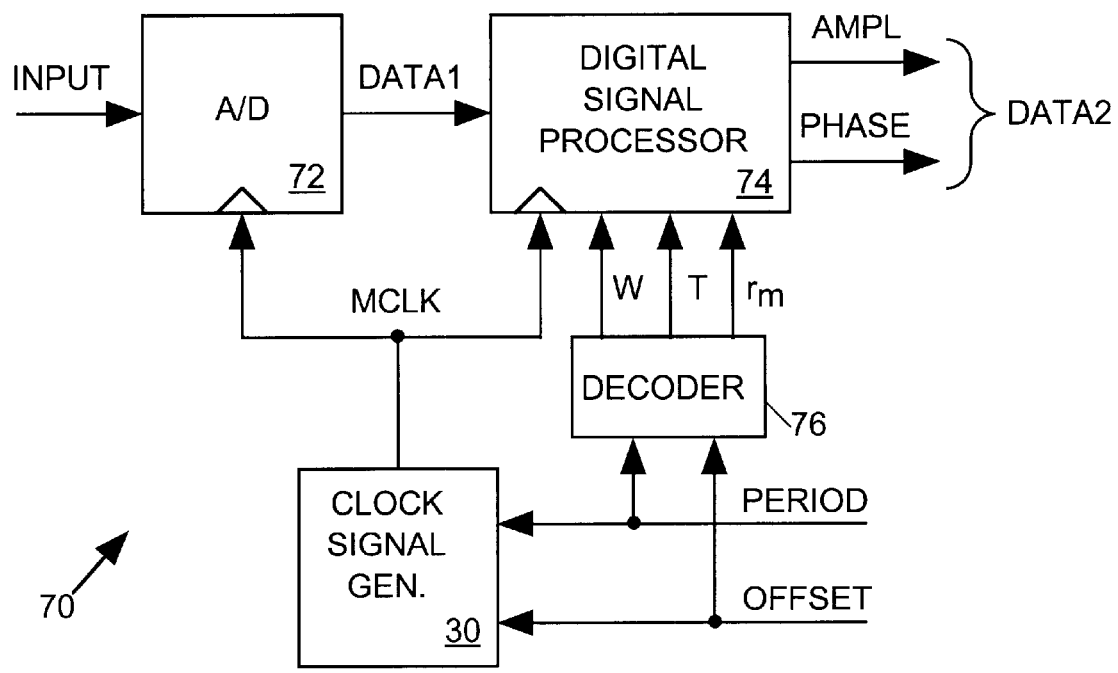
FIG. 11 is a block diagram of an apparatus for the conversion of analog signals into digital frequency domain data sequences in accordance with the invention.

FIG. 11 illustrates a digital spectrum analyzer 70 employing the clock signal generator 30 of FIG. 3 to provide an MCLK signal for clocking both an A/D converter 72 and a digital signal processor (DSP) 74. A/D converter 72 converts an analog INPUT signal into a digital data sequence DATA1. DSP 74 then converts the time varying DATA1 sequence into two frequency domain sequences DATA2 representing the amplitude and phase of each frequency component of the INPUT signal.

Suppose the INPUT signal has a period T=20P and we want A/D converter 72 to digitize this signal at four evenly spaced intervals per period T. In such case clock signal generator 30 can clock digitizer 72 and DSP 74 with the MCLK(e) signal of FIG. 7 and there will be no timing errors in the digitization of the INPUT signal. Since the MCLK(e) signal produces uniformly spaced pulses at precisely the desired sampling frequency of the INPUT signal, DSP 74 can use a conventional digital fourier transform (DFT) algorithm to generate DATA2 sequences accurately representing the frequency components of the INPUT signal.

Suppose we wish to digitize an INPUT signal having a period T=21P four times per period T. In this case clock signal generator 30 will not be able to produce an MCLK signal having evenly spaced pulses with the desired period of 21P/4. We can, however, program clock signal generator 30 to produce an MCLK signal similar to the MCLK(f) signal of FIG. 9 having an average period of 21P/4. But since the MCLK(f) signal does not clock A/D converter 72 at a uniform rate, the DATA2 sequences DSP 74 produces using a conventional DFT algorithm will not accurately represent the frequency components of the INPUT signal because such algorithms require signals to be digitized at uniform rates. However, if the timing error in the MCLK(f) signal produces sufficiently small error in the DATA2 sequences, such errors may be tolerable.

On the other hand if the errors in the DATA2 sequences are not tolerable then DSP 74 can compensate for the errors using a modified DFT algorithm such as described in the paper by Y-C Jeng ("Perfect Reconstruction of Digital Spectrum from Nonuniformly Sampled Signals," *IEEE Transactions on Instrumentation and Measurement*, volume 46(3), page 649 (1997)). The modified DFT algorithm allows DSP 74 to reconstruct the correct digital spectrum of the INPUT signal when the MCLK signal has non-uniform timing provided that the sample timing is known. Accordingly a decoder 76 converts control data PERIOD and OFFSET supplied as input to clock signal generator 30 to define the MCLK signal into a set of data $r_m$, M, and T defining the MCLK signal in a manner compatible with the modified DFT algorithm. When DSP 74 uses the $r_m$, M, and T data to adjust the modified DFT algorithm, the DATA2 sequences spectrum analyzer 70 provides will accurately represent the frequency components of the INPUT signal even when clock signals with non-uniform timing are used in accordance with the invention.

Error Compensation (Arbitrary Waveform Generator)

Figure 12:
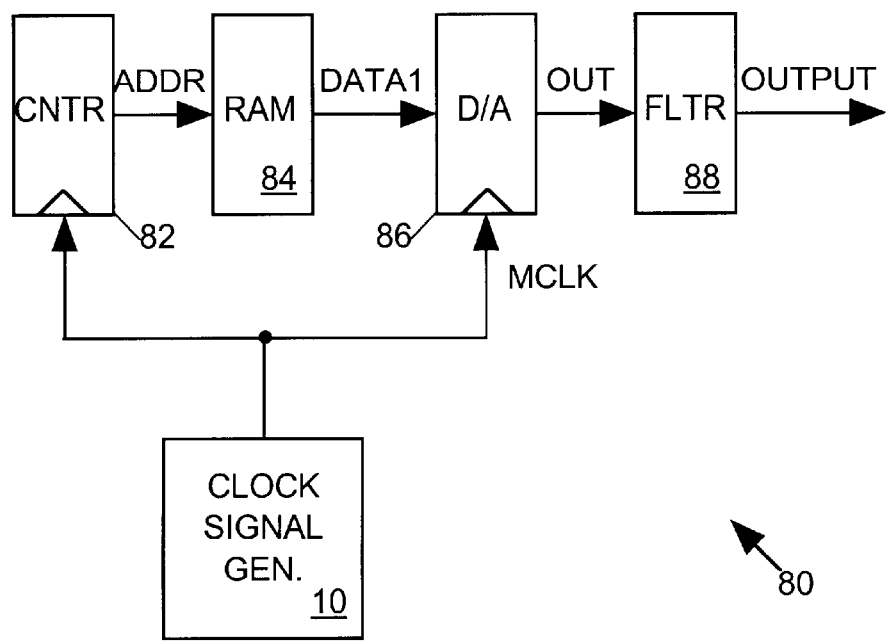
FIG. 12 illustrates in block diagram form a prior art apparatus for the conversion of digital data sequences into analog signals.

Arbitrary waveform generators represent another application wherein a mismatch between the frequency of the signal being processed and the frequency of the clock signal controlling the processing will lead to errors. FIG. 12 depicts a prior art arbitrary waveform generator 80 wherein a prior art clock signal generator 10 of FIG. 1 clocks a counter 82 addressing a random access memory (RAM) 84 reading out data (DATA1) to a digital-to-analog (D/A) converter 86. The MCLK signal also tells D/A converter 86 to convert its input DATA1 value into a corresponding analog voltage OUT. A filter circuit 88 smoothes the OUT signal voltage sequence to provide an analog output waveform, OUTPUT.

The waveform data stored in RAM 84 specifies the amplitude of the desired OUTPUT waveform while the MCLK signal determines the frequency of the actual OUTPUT waveform. If the MCLK frequency required to achieve the correct OUTPUT waveform frequency is an integer multiple of the period resolution P of clock signal generator 10, then arbitrary waveform generator 80 can produce the correct OUTPUT waveform frequency. For example, suppose the desired OUTPUT waveform has period 50P, and 10 data values stored in RAM 84 specify each OUTPUT waveform cycle. Then clock signal generator 10 can supply a signal such as MCLK(e) of FIG. 7 having a period 5P to exactly match the required data timing.

Figure 13:
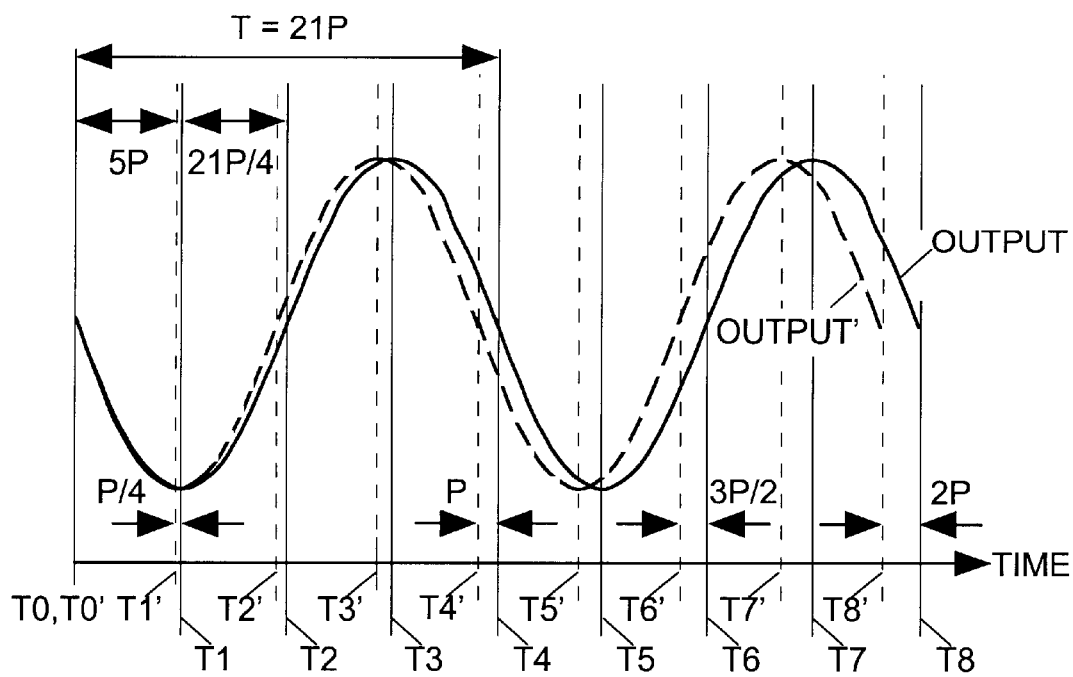
FIG. 13 is a timing diagram comparing the actual OUTPUT' signal of the apparatus of FIG. 12 to the desired OUTPUT signal when the desired timing interval of the OUTPUT signal is not an integer multiple of the clock signal period resolution.

However, if clock signal generator 10 cannot provide an MCLK signal of the appropriate frequency then the OUTPUT waveform will not have the desired frequency. FIG. 13 is a timing diagram comparing an actual OUTPUT' waveform to a desired OUTPUT waveform when clock signal generator 10 cannot supply an MCLK signal of the correct frequency. In this case the desired OUTPUT waveform has a period T=21P and four data values stored in RAM 84 define OUTPUT signal amplitudes at four evenly spaced intervals during each OUTPUT signal cycle. Thus, for arbitrary waveform generator 80 to produce the correct OUTPUT waveform frequency, clock signal generator 10 should supply an MCLK signal having a period of 21P/4. However, the closest clock signal generator 10 can get to matching the desired MCLK signal period 21P/4 is to provide an MCLK signal having period 5P such as the MCLK(e) signal of FIG. 7. When the MCLK(e) signal clocks counter 82, RAM 84 reads out a data value to D/A converter 86 once every 5P seconds instead of once every 21P/4 seconds as illustrated in FIG. 13. This causes arbitrary waveform generator 80 to produce an OUTPUT' waveform having a higher frequency than desired.

Figure 14:
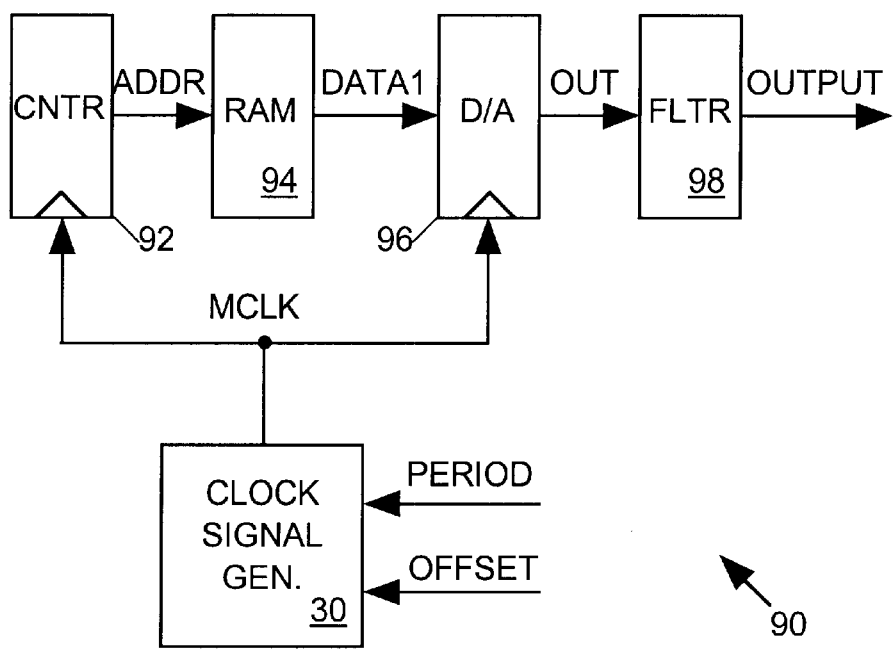
FIG. 14 illustrates in block diagram form an apparatus in accordance with the invention for the conversion of digital data sequences into analog signals.

FIG. 14 illustrates an arbitrary waveform generator 90 employing the clock signal generator 30 of FIG. 3 to clock a counter 92 addressing a random access memory (RAM) 94 reading out data (DATA1) to a D/A converter 96. The MCLK signal also clocks D/A converter 96 as it converts the DATA1 sequence into corresponding analog voltages OUT. A filter circuit 98 smooths the OUT signal to provide an OUTPUT waveform. In accordance with the invention clock signal generator 30 occasionally adjusts the period between MCLK signal pulses to compensate for accumulating timing errors resulting when clock signal generator 30 must produce MCLK signals with nominal frequencies other than 1/k*P, where k is an integer.

Figure 15:
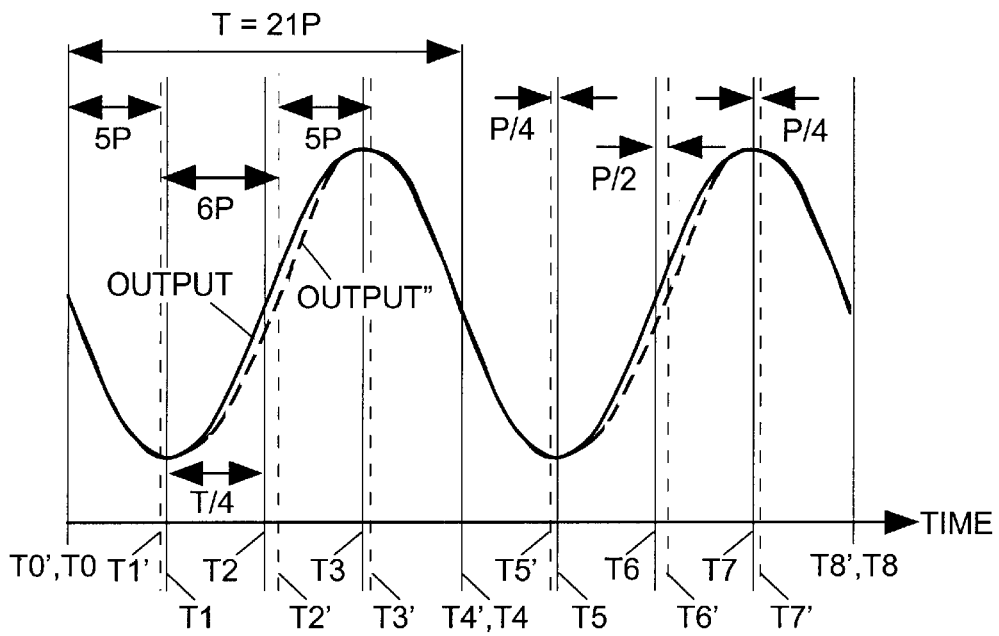
FIG. 15 is a timing diagram comparing the actual OUTPUT" signal of the apparatus of FIG. 14 to the desired OUTPUT signal when the desired timing interval of the OUTPUT signal is not an integer multiple of the clock signal period resolution and wherein timing errors have been compensated for in accordance with the invention.

FIG. 15 is a timing diagram illustrating an OUTPUT" waveform produced when clock signal generator 30 of FIG. 14 provides the MCLK(f) signal of FIG. 9. RAM 94 contains four data values defining OUTPUT signal amplitudes at four evenly spaced intervals during each OUTPUT signal cycle. The desired OUTPUT waveform has a period T=21P. The MCLK(f) signal has the desired period of 21P/4 but the actual period between MCLK(f) signal pulses switches from 5P to 6P once every four MCLK(f) signal cycles. The actual D/A conversion times T0'–T8' do not always match the desired conversion times T0–T8 but the timing error or jitter is always less than P/2. When the maximum timing errors P/2 lie within acceptable limits, the OUTPUT" waveform will be an acceptable approximation of the desired OUTPUT waveform of period 21P.

Sequencer Architecture

Sequencer 38 of FIG. 3 provides SW data and SKIP data sequences controlling the timing of each pulse of the MCLK signal provided by clock signal generator 30. Control data PERIOD and OFFSET supplied as input to sequencer 38 define the SW and SKIP data sequences.

Figure 16:
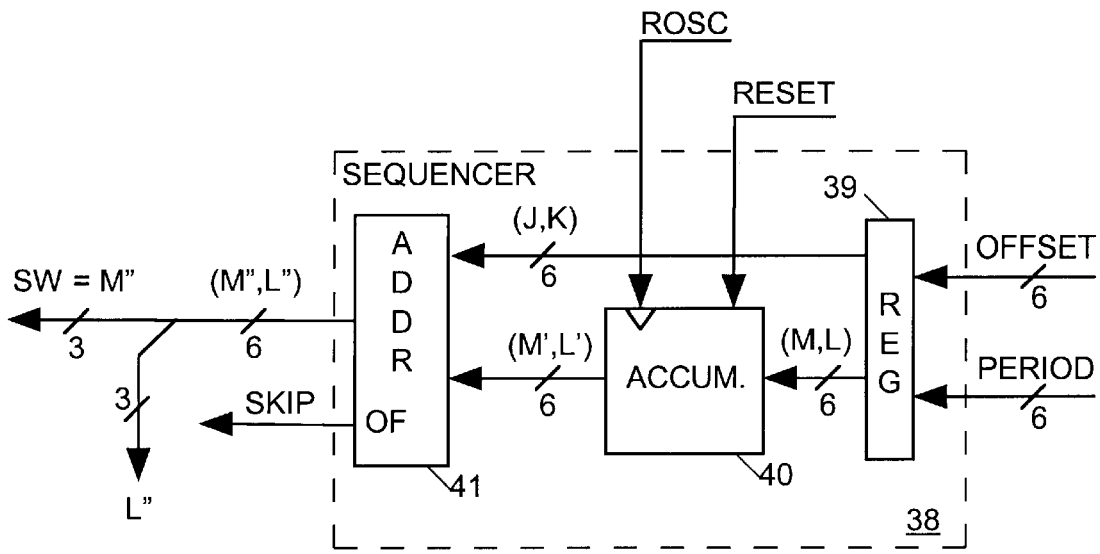
FIG. 16 is a block diagram illustrating the sequencer 38 of FIG. 3 in greater detail.

FIG. 16 illustrates sequencer 38 of FIG. 3 in more detailed block diagram form. The PERIOD data word loaded in a register 39 has form (M,L) where M and L represent the three most significant bits (MSBs) and three least significant bits (LSBs) of the word respectively. Register 39 supplies the (M,L) data as input to an accumulator 40. Clocked by the ROSC signal, accumulator 40 accumulates (M,L) to provide a 6-bit input data word (M',L') to an adder 41. Adder 41 adds the 6-bit OFFSET data also stored in register 39 to the (M',L') data word to produce a 6-bit output data word (M",L"). The three most significant bits M" of the (M",L") word become the SW data input to multiplexer 35. Adder 41 overflows whenever the value of SW exceeds the value of the highest input to multiplexer 35, in this example when SW exceeds 4 (or 100 binary). An overflow output of adder 41 provides the SKIP signal to the gating circuits 36 and 37 of FIG. 3. A RESET signal supplied to accumulator 40 resets the value of data word (M',L') to (0,0).

We specify the SW and SKIP signal sequences by appropriately adjusting the PERIOD and OFFSET data stored in register 39. The value of the PERIOD word determines the average period between pulses of the MCLK signal. The L data value determines the number of ROSC signal cycles occurring between timing error compensation periods. The OFFSET data has form (J,K) where J and K represent the most and least significant three bits of the OFFSET data respectively. The J data ranges in value from 0–4 and determines which input signal T0–T4 multiplexer 35 of FIG. 3 initially selects. The least significant bits K of the OFFSET data sets the delay between the initial MCLK signal pulse and the first error compensating MCLK signal cycle. In the example of FIG. 16 the value of K ranges from 0–7.

Suppose, for example, we wish to produce the MCLK(a) signal of FIG. 2. Since the MCLK(a) signal has a uniform period of 5P we want the SW data to be constant value and thus we set PERIOD=(0,0) in register 39. Thus accumulator 40 provides a continuous (M',L')=(0,0) output to adder 41. Since (M',L') always equals (0,0) adder 41 never overflows and never asserts the SKIP signal. We set the value of OFFSET to (1,0) so that sequencer 38 provides a repeating sequence of SW=1, thus causing multiplexer 35 to always select tap signal $T_1$.

To provide the MCLK(b) signal of FIG. 2 we specify an SW data sequence instructing multiplexer 35 to continuously increment its tap signal selection so that the MCLK signal has period 6P. Accordingly we set PERIOD=(1,0) and OFFSET=(0,0). Sequencer 38 then provides a repeating SW signal sequence of SW={1,2,3,4,5} with a corresponding repeating SKIP signal sequence of SKIP={0,0,0,0,1}.

Clock signal generator 30 provides the MCLK(f) signal of FIG. 9 when we set PERIOD=(0,2) and OFFSET=(0,2). Thus sequencer 38 provides an SW sequence of SW={0,0, 1,1,1,1,2,2,2,2, . . . } and a SKIP signal sequence of SKIP={0,0,1,0,0,0,1,0, . . . }.

Thus we can use the values of signals PERIOD and OFFSET to configure clock signal generator 30 of FIG. 3 to provide MCLK clock signals wherein the delay between successive MCLK signal edges is altered in a systematic and predetermined manner in accordance with the invention. Clock signal generator 30 can produce a wider range of clock signal frequencies than prior art clock signal generator 10 of FIG. 1. Although clock signal generator 30 can adjust the periods between successive pulses of the MCLK signal with an actual resolution of P, it can adjust the average period between MCLK signal pulses with an effective resolution of $P/2^L$, where P is the period resolution of the clock signal generator and L is the number of least significant bits of the PERIOD data input to clock signal generator 30. In the example of clock signal generator 30 of FIG. 3, L=3 so the effective resolution with which we may adjust the average MCLK signal period is $P/2^3=P/8$. If we increase the bit width of devices 39–41 of FIG. 16 we can increase the size of L and further improve the effective period resolution of clock signal generator 30. While clock signal generator 30 provides MCLK signals approximating a greater range of frequencies it also introduces some jitter in the MCLK signal. But as discussed above, many applications can tolerate a small amount of clock signal jitter.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for generating a clock signal pulse sequence, the apparatus comprising:

first means for concurrently generating N timing signal pulse sequences each having a period of $P_{ref}$ seconds between successive pulses, said N timing signal pulse sequences being distributed in phase with a phase difference of $P_{ref}/N$ between successively phased timing signal pulse sequences; and second means for successively selecting ones of said N timing signal pulse sequences and for generating pulses of said clock signal pulse sequence in response to pulses of the selected timing signal pulse sequences, such that said clock signal pulse sequence has an average period between successive pulses thereof approaching T seconds, wherein N is an integer greater than 2, wherein $P_{ref}$ is a number greater than 0, and wherein T is a non-integer multiple of $P_{ref}/N$.

2. The apparatus in accordance with claim 1 wherein said first means comprises:

means for generating a reference clock signal having a period of $P_{ref}$ seconds; and third means responsive to said reference clock signal for concurrently generating said N timing signal pulse sequences, each being frequency locked to said reference clock signal.

3. The apparatus in accordance with claim 2 wherein said third means comprises:

a plurality of gates connected in a series, each for producing a separate one of said timing signal pulse sequences as output; and means responsive to the reference clock signal for controlling a switching speed of said gates such that said timing signal sequences produced by successive gates of said series are $P_{ref}/N$ seconds out of phase with each other.

4. The apparatus in accordance with claim 1 wherein said first means comprises:

means for generating a reference clock signal having a period of $P_{ref}$ seconds, third means responsive to said reference clock signal for periodically incrementing a control data value having M" most significant bits and L" least significant bits by a constant data value having M most significant bits and L least significant bits; and means for successively selecting said ones of said N timing signal pulse sequences in response to said M" most significant bits of said control data value, and for generating pulses of said clock signal sequence in response to pulses of the selected timing signal sequences, wherein M, M", L and L" are non-zero integers, and wherein a quantity $2^{M"}$ is at least as large as N.

5. The apparatus in accordance with claim 4 wherein third means comprises:

means for accumulating said constant data value having M most significant bits and L least significant bits to produce an intermediate control data value having M' most significant bits and L' least significant bits in response to said reference clock signal; and means for adding said intermediate control data value having M' most significant bits and L' least significant bits to an offset data value having J most significant bits and K least significant bits to produce said control data value having M" most significant bits and L" least significant bits, wherein M',L', J and K are non-zero integers.

6. An apparatus for digitizing an analog signal, the apparatus comprising:

first means for converting said analog signal into a sequence of digital data values in response to a clock signal pulse sequence;

second means for concurrently generating N timing signal pulse sequences each having a period of $P_{ref}$ seconds between successive pulses, said N timing signal pulse sequences being distributed in phase with a phase difference of $P_{ref}/N$ between successively phased timing signal pulse sequences; and third means for successively selecting ones of said N timing signal pulse sequences and for generating pulses of said clock signal pulse sequence in response to pulses of the selected timing signal pulse sequences, such that said clock signal pulse sequence has an average period between successive pulses thereof approaching T seconds, wherein N is an integer greater than 2, wherein $P_{ref}$ is a number greater than 0, and wherein T is a non-integer multiple of $P_{ref}/N$.

7. The apparatus in accordance with claim 6 wherein said second means comprises:

means for generating a reference clock signal having a period of $P_{ref}$ seconds; and fourth means responsive to said reference clock signal for concurrently generating said N timing signal pulse sequences, each being frequency locked to said reference clock signal.

8. The apparatus in accordance with claim 7 wherein said fourth means comprises:

a plurality of gates connected in a series, each for producing a separate one of said timing signal pulse sequences as output; and means responsive to the reference clock signal for controlling a switching speed of said gates such that said timing signal sequences produced by successive gates of said series are $P_{ref}/N$ seconds out of phase with each other.

9. The apparatus in accordance with claim 6 wherein said third means comprises:

means for generating a reference clock signal having a period of $P_{ref}$ seconds, fifth means responsive to said reference clock signal for periodically incrementing a control data value having M" most significant bits and L" least significant bits by a constant data value having M most significant bits and L least significant bits; and means for successively selecting said ones of said N timing signal pulse sequences in response to said M" most significant bits of said control data value, and for generating pulses of said clock signal sequence in response to pulses of the selected timing signal sequences, wherein M, M", L and L" are non-zero integers, and wherein a quantity $2^{M"}$ is at least as large as N.

10. The apparatus in accordance with claim 9 wherein said fifth means comprises:

means for accumulating said constant data value having M most significant bits and L least significant bits to produce an intermediate control data value having M' most significant bits and L' least significant bits in response to said reference clock signal; and means for adding said intermediate control data value having M' most significant bits and L' least significant bits to an offset data value having J most significant bits and K least significant bits to produce said control data value having M" most significant bits and L" least significant bits, wherein M', L', J and K are non-zero integers.

11. An apparatus for producing output data representing a frequency spectrum of an analog signal, the apparatus comprising:

first means for converting said analog signal into a sequence of digital data values in response to a clock signal pulse sequence, second means for producing said output data as a function of said sequence of digital data values;

third means for concurrently generating N timing signal pulse sequences each having a period of $P_{ref}$ seconds between successive pulses, said N timing signal pulse sequences being distributed in phase with a phase difference of $P_{ref}/N$ between successively phased timing signal pulse sequences; and fourth means for successively selecting ones of said N timing signal pulse sequences and for generating pulses of said clock signal pulse sequence in response to pulses of the selected timing signal pulse sequences, such that said clock signal pulse sequence has an average period between successive pulses thereof approaching T seconds, wherein N is an integer greater than 2, wherein $P_{ref}$ is a number greater than 0, and wherein T is a non-integer multiple of $P_{ref}/N$.

12. The apparatus in accordance with claim 11 wherein said third means comprises:

means for generating a reference clock signal having a period of $P_{ref}$ seconds; and fifth means responsive to said reference clock signal for concurrently generating said N timing signal pulse sequences, each being frequency locked to said reference clock signal.

13. The apparatus in accordance with claim 12 wherein said fifth means comprises:

a plurality of gates connected in a series, each for producing a separate one of said timing signal pulse sequences as output; and means responsive to the reference clock signal for controlling a switching speed of said gates such that said timing signal sequences produced by successive gates of said series are $P_{ref}/N$ seconds out of phase with each other.

14. The apparatus in accordance with claim 11 wherein said fourth means comprises:

means for generating a reference clock signal having a period of $P_{ref}$ seconds, sixth means responsive to said reference clock signal for periodically incrementing a control data value having M" most significant bits and L" least significant bits by a constant data value having M most significant bits and L least significant bits; and means for successively selecting said ones of said N timing signal pulse sequences in response to said M" most significant bits of said control data value, and for generating pulses of said clock signal sequence in response to pulses of the selected timing signal sequences, wherein M, M", L and L" are non-zero integers, and wherein a quantity $2^{M"}$ is at least as large as N.

15. The apparatus in accordance with claim 14 wherein said sixth means comprises:

means for accumulating said constant data value having M most significant bits and L least significant bits to produce an intermediate control data value having M' most significant bits and L' least significant bits in response to said reference clock signal; and means for adding said intermediate control data value having M' most significant bits and L' least significant bits to an offset data value having J most significant bits and K least significant bits to produce said control data value having M" most significant bits and L" least significant bits, wherein M', L', J and K are non-zero integers.

16. An apparatus in accordance with claim 11 wherein said second means receives control data specifying timing of all said pulses of said clock signal pulse sequence and produces said output data as a function of said sequence of digital data values and said control data.

17. An apparatus for generating an arbitrary waveform, the apparatus comprising:

first means for providing a sequence of address values in response to a clock signal pulse sequence;

second means for storing a plurality of digital data values specifying a waveform to be generated, and for reading out said digital data values in response to said sequence of address values;

third means for converting said sequence of ones of said plurality of digital data values into a sequence of analog voltages, fourth means for filtering said sequence of analog voltages to provide said arbitrary waveform;

fifth means for concurrently generating N timing signal pulse sequences each having a period of $P_{ref}$ seconds between successive pulses, said N timing signal pulse sequences being distributed in phase with a phase difference of $P_{ref}/N$ between successively phased timing signal pulse sequences; and sixth means for successively selecting ones of said N timing signal pulse sequences and for generating pulses of said clock signal pulse sequence in response to pulses of the selected timing signal pulse sequences, such that said clock signal pulse sequence has an average period between successive pulses thereof approaching T seconds, wherein N is an integer greater than 2, wherein $P_{ref}$ is a number greater than 0, and wherein T is a non-integer multiple of $P_{ref}/N$.

18. The apparatus in accordance with claim 17 wherein said fifth means comprises:

means for generating a reference clock signal having a period of $P_{ref}$ seconds; and seventh means responsive to said reference clock signal for concurrently generating said N timing signal pulse sequences, each being frequency locked to said reference clock signal.

19. The apparatus in accordance with claim 18 wherein said seventh means comprises:

a plurality of gates connected in a series, each for producing a separate one of said timing signal pulse sequences as output; and means responsive to the reference clock signal for controlling a switching speed of said gates such that said timing signal sequences produced by successive gates of said series are $P_{ref}/N$ seconds out of phase with each other.

20. The apparatus in accordance with claim 17 wherein said sixth means comprises:
  means for generating a reference clock signal having a period of $P_{ref}$ seconds,
  eighth means responsive to said reference clock signal for periodically incrementing a control data value having M" most significant bits and L" least significant bits by a constant data value having M most significant bits and L least significant bits; and
  means for successively selecting said ones of said N timing signal pulse sequences in response to said M" most significant bits of said control data value, and for generating pulses of said clock signal sequence in response to pulses of the selected timing signal sequences,
  wherein M, M", L and L" are non-zero integers, and wherein a quantity $2^{M''}$ is at least as large as N.

21. The apparatus in accordance with claim 20 wherein said eighth means comprises:
  means for accumulating said constant data value having M most significant bits and L least significant bits to produce an intermediate control data value having M' most significant bits and L' least significant bits in response to said reference clock signal; and
  means for adding said intermediate control data value having M' most significant bits and L' least significant bits to an offset data value having J most significant bits and K least significant bits to produce said control data value having M" most significant bits and L" least significant bits,
  wherein M', L', J and K are non-zero integers.

22. A method for generating a clock signal pulse sequence, the method comprising the steps of:
  a. concurrently generating N timing signal pulse sequences each having a period of $P_{ref}$ seconds between successive pulses, said N timing signal pulse sequences being distributed in phase with a phase difference of $P_{ref}/N$ between successively phased timing signal pulse sequences;
  b. successively selecting ones of said N timing signal pulse sequences; and
  c. generating pulses of said clock signal pulse sequence in response to pulses of the selected timing signal pulse sequences, such that said clock signal pulse sequence has an average period between successive pulses thereof approaching T seconds,
    wherein N is an integer greater than 2,
    wherein $P_{ref}$ is a number greater than 0, and
    wherein T is a non-integer multiple of $P_{ref}/N$.

23. The method in accordance with claim 22 wherein said step b comprises the substeps of:
  b1. generating a reference clock signal having a period of $P_{ref}$ seconds,
  b2. periodically incrementing a control data value having M" most significant bits and L" least significant bits by a constant data value having M most significant bits and L least significant bits in response to said reference clock signal; and
  b3. successively selecting said ones of said N timing signal pulse sequences in response to only said M" most significant bits of said control data value,
    wherein M, M", L and L" are non-zero integers, and
    wherein a quantity $2^{M''}$ is at least as large as N.

24. A method for digitizing an analog signal, the method comprising the steps of:
  a. converting said analog signal into a sequence of digital data values in response to a clock signal pulse sequence,
  b. concurrently generating N timing signal pulse sequences each having a period of $P_{ref}$ seconds between successive pulses, said N timing signal pulse sequences being distributed in phase with a phase difference of $P_{ref}/N$ between successively phased timing signal pulse sequences;
  c. successively selecting ones of said N timing signal pulse sequences; and
  d. generating pulses of said clock signal pulse sequence in response to pulses of the selected timing signal pulse sequences, such that said clock signal pulse sequence has an average period between successive pulses thereof approaching T seconds,
    wherein N is an integer greater than 2,
    wherein $P_{ref}$ is a number greater than 0, and
    wherein T is a non-integer multiple of $P_{ref}/N$.

25. The method in accordance with claim 24 wherein step c comprises the substeps of:
  c1. generating a reference clock signal having a period of $P_{ref}$ seconds,
  c2. periodically incrementing a control data value having M" most significant bits and L" least significant bits by a constant data value having M most significant bits and L least significant bits in response to said reference clock signal; and
  c3. successively selecting said ones of said N timing signal pulse sequences in response to said M" most significant bits of said control data value,
    wherein M, M", L and L" are non-zero integers, and
    wherein a quantity $2^{M''}$ is at least as large as N.

26. A method for producing output data representing a frequency spectrum of an analog signal, the method comprising the steps of:
  a. converting said analog signal into a sequence of digital data values in response to a clock signal pulse sequence,
  b. producing said output data as a function of said sequence of digital data values;
  c. concurrently generating N timing signal pulse sequences each having a period of $P_{ref}$ seconds between successive pulses, said N timing signal pulse sequences being distributed in phase with a phase difference of $P_{ref}/N$ between successively phased timing signal pulse sequences;
  d. successively selecting ones of said-N timing signal pulse sequences; and
  e. generating pulses of said clock signal pulse sequence in response to pulses of the selected timing signal pulse sequences, such that said clock signal pulse sequence has an average period between successive pulses thereof approaching T seconds,
    wherein N is an integer greater than 2,
    wherein $P_{ref}$ is a number greater than 0, and
    wherein T is a non-integer multiple of $P_{ref}/N$.

27. The method in accordance with claim 26 wherein step d comprises the substeps of:
  d1. generating a reference clock signal having a period of $P_{ref}$ seconds,
  d2. periodically incrementing a control data value having M" most significant bits and L" least significant bits by a constant data value having M most significant bits and L least significant bits in response to said reference clock signal; and d3. successively selecting said ones of said N timing signal pulse sequences in response to said M" most significant bits of said control data value, wherein M, M", L and L" are non-zero integers, and wherein a quantity $2^{M''}$ is at least as large as N.

28. The method in accordance with claim 26 wherein step b comprises the substeps of:
   b1. receiving control data specifying timing of all said pulses of said clock signal pulse sequence, and
   b2. producing said output data as a function of said sequence of digital data values and said control data.

29. A method for generating an arbitrary waveform, the method comprising the steps of:
   a. providing a sequence of address values in response to a clock signal pulse sequence;
   b. providing a sequence of digital data values in response to said sequence of address values, said sequence of digital data values specifying said arbitrary waveform to be generated;
   c. converting said sequence of digital data values into a sequence of analog voltage values,
   d. filtering said sequence of analog voltage values to provide said arbitrary waveform;
   e. concurrently generating N timing signal pulse sequences each having a period of $P_{ref}$ seconds between successive pulses, said N timing signal pulse sequences being distributed in phase with a phase difference of $P_{ref}/N$ between successively phased timing signal pulse sequences;
   f. successively selecting ones of said N timing signal pulse sequences; and
   g. generating pulses of said clock signal pulse sequence in response to pulses of the selected timing signal pulse sequences, such that said clock signal pulse sequence has an average period between successive pulses thereof approaching T seconds, wherein N is an integer greater than 2, wherein $P_{ref}$ is a number greater than 0, and wherein T is a non-integer multiple of $P_{ref}/N$.

30. The method in accordance with claim 29 wherein step f comprises the substeps of:
   f1. generating a reference clock signal having a period of $P_{ref}$ seconds,
   f2. periodically incrementing a control data value having M" most significant bits and L" least significant bits by a constant data value having M most significant bits and L least significant bits in response to said reference clock signal; and
   f3. successively selecting said ones of said N timing signal pulse sequences in response to said M" most significant bits of said control data value, wherein M, M", L and L" are non-zero integers, and wherein a quantity $2^{M''}$ is at least as large as N.

* * * * *